US010321555B1

(12) United States Patent
Trulli et al.

(10) Patent No.: US 10,321,555 B1
(45) Date of Patent: Jun. 11, 2019

(54) PRINTED CIRCUIT BOARD BASED RF CIRCUIT MODULE

(71) Applicant: Raytheon Company, Waltham, MA (US)

(72) Inventors: Susan C. Trulli, Lexington, MA (US); Christopher M. Laighton, Boxborough, MA (US); Elicia K. Harper, Chelsea, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/121,007

(22) Filed: Sep. 4, 2018

(51) Int. Cl.
| | |
|---|---|
| *H05K 1/14* | (2006.01) |
| *H05K 1/18* | (2006.01) |
| *H05K 1/02* | (2006.01) |
| *H01P 3/08* | (2006.01) |
| *H05K 1/11* | (2006.01) |

(52) U.S. Cl.
CPC ........... *H05K 1/0219* (2013.01); *H01P 3/081* (2013.01); *H05K 1/111* (2013.01); *H05K 1/183* (2013.01); *H05K 1/0203* (2013.01); *H05K 2201/0723* (2013.01); *H05K 2201/093* (2013.01); *H05K 2201/09036* (2013.01); *H05K 2201/10734* (2013.01)

(58) Field of Classification Search
CPC ........ H05K 1/142; H05K 1/144; H05K 1/145; H05K 1/183; H05K 1/0203; H05K 2201/093

See application file for complete search history.

(56) References Cited

U.S. PATENT DOCUMENTS

| | | | | |
|---|---|---|---|---|
| 7,116,557 | B1* | 10/2006 | Raby ...................... | H05K 1/021 361/720 |
| 2001/0048164 | A1* | 12/2001 | Tateoka ................... | H01L 23/66 257/758 |
| 2003/0060172 | A1 | 3/2003 | Kuriyama et al. | |
| 2005/0051356 | A1* | 3/2005 | Sumi ....................... | H01B 1/22 174/257 |
| 2008/0023810 | A1* | 1/2008 | Yamazaki ........ | G06K 19/07728 257/679 |
| 2008/0296056 | A1* | 12/2008 | Kinoshita ............... | H01L 23/13 174/261 |
| 2009/0014732 | A1* | 1/2009 | Nishida ............... | H01L 25/0753 257/88 |

(Continued)

*Primary Examiner* — Hoa C Nguyen
(74) *Attorney, Agent, or Firm* — Daly, Crowley, Mofford & Durkee, LLP

(57) ABSTRACT

An RF circuit module having RF and DC contacts on a surface of a circuit board. An RF component having RF and DC contacts is disposed in a cavity of the circuit board. Electrical connectors bridge the cavity to connect the RF contacts on the circuit board to the RF contacts on the RE component and the DC, contacts on the circuit board to the DC contacts on the RF component. A plug member is disposed in the cavity which has a dielectric member with an outer portion disposed over the RF and DC contacts on the circuit board and an inner portion elevated above the RF and DC contacts the RF component. The plug member has one portion of electrical conductors disposed on an upper surface of the inner portion and another portion disposed under the outer portion on, and electrically connected to, the DC contacts on the circuit board.

12 Claims, 14 Drawing Sheets

(56) References Cited

U.S. PATENT DOCUMENTS

| | | | |
|---|---|---|---|
| 2012/0043127 A1* | 2/2012 | Lin | H05K 1/0203 |
| | | | 174/266 |
| 2013/0276969 A1* | 10/2013 | Chang | H05K 3/4697 |
| | | | 156/250 |
| 2016/0143148 A1* | 5/2016 | Hosomi | H05K 1/183 |
| | | | 361/761 |
| 2017/0064835 A1* | 3/2017 | Ishihara | H05K 3/4682 |
| 2017/0104022 A1* | 4/2017 | Okamura | H05K 3/4697 |
| 2017/0325332 A1* | 11/2017 | Long | H05K 1/144 |
| 2018/0005949 A1* | 1/2018 | Lin | H01L 21/4857 |

* cited by examiner

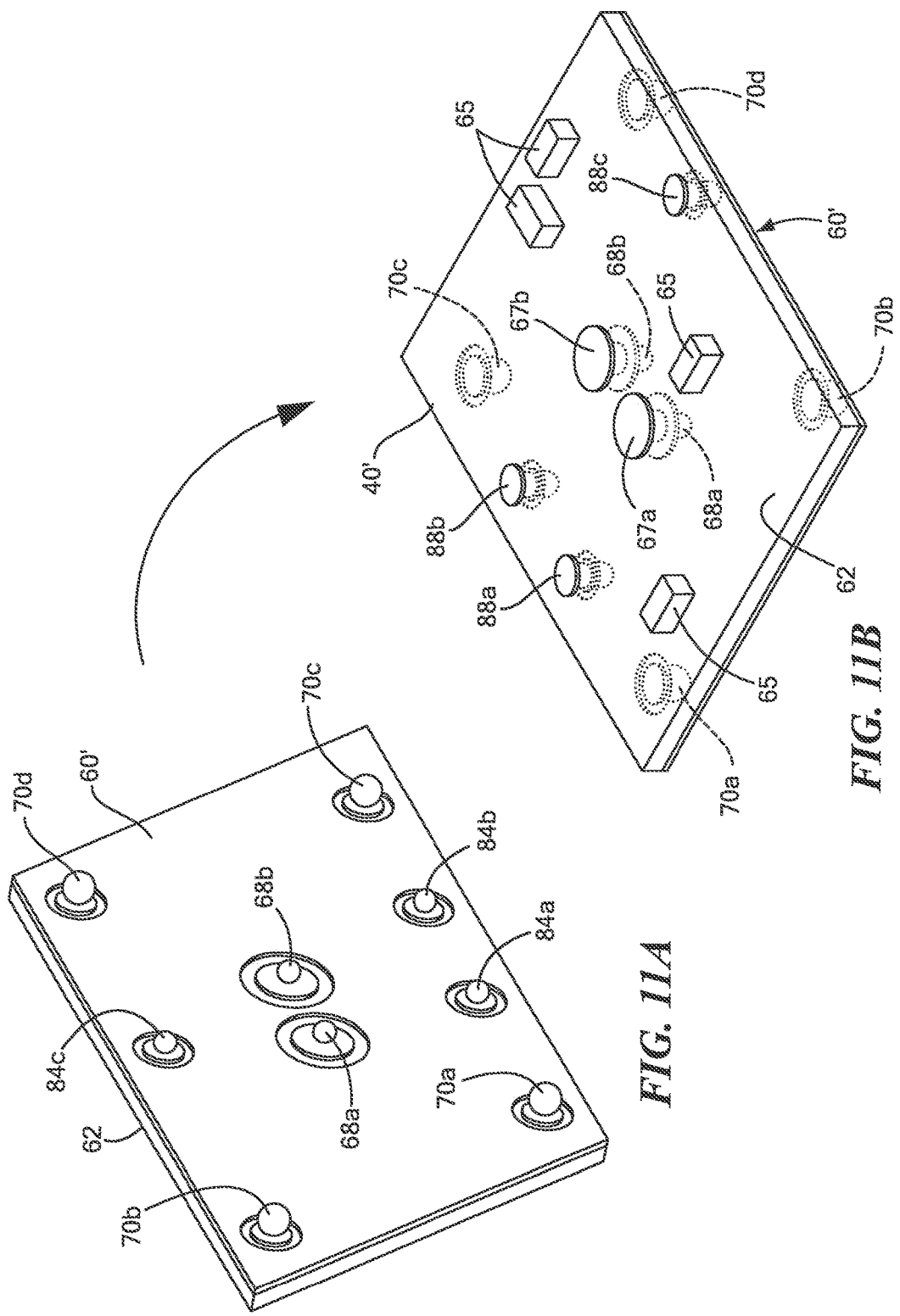

PRINTED CIRCUIT BOARD BASED RF CIRCUIT MODULE

TECHNICAL FIELD

This disclosure relates generally to printed circuit board based Radio Frequency (RF) circuit modules and more particularly to printed circuit board based Radio Frequency (RF) circuit modules adapted for connecting RF and DC energy to an RF component within the module.

BACKGROUND OF THE INVENTION

As is known in the art, one type of printed circuit board based Radio Frequency (RF) circuit module includes a multilayer printed circuit board having a plurality of cavities aligned one with the other and of increasing size to receive an RF circuit, such as a Monolithic Microwave Integrated Circuit (MMIC) chip. One such arrangement is shown in FIG. 1 to include a cold plate having a multilayer printed circuit board (PCB). The multilayer printed circuit board (PCB) has a plurality of stacked layers, here four vertically stacked layers (PCB_1-PCB_4) with vertically aligned cavities to receive a MMIC chip, here mounted to a heat spreader and bonded to the cold plate with a suitable conductive epoxy, as shown. It is noted that the cavity in the layer PCB_2 is larger than the cavity in layer PCB_1. It is also noted that the portion of the layer PCB_1 closest to the MMIC a has a lower ground metal bonded to the cold plate with a conductive epoxy and an upper signal strip conductor, as shown, to form a microstrip transmission line section for coupling RF energy to and from the MMIC by wires connected between contact pads, as indicated while the portion of the portion of the layer PCB_2, having an upper ground metal, together with the underlying portion of PCB_1, provides a stripling transmission line for coupling RF energy to and from the microstrip transmission line section provided by layers PCB_1, PCB_3 and PCB_4 provide structure for enabling DC power to be supplied to the MMIC chip with DC voltage wires between contact pads, as shown. It is noted that the cavities in layer PCB_4 is larger than the cavities in layer PCB_2 and layer PCB_3 to enable the attachment of the DC voltage wires to the DC metal on the upper surface of the layer PCB_3. A top ground metal is provided on the upper surface of layer PCB_4, as shown. These cavities add cost to the module.

SUMMARY OF THE INVENTION

In accordance with the disclosure, an RF circuit module is provided having RF and DC contacts on a surface of a circuit board. An RF component having RF and DC contacts is disposed in a cavity of the circuit board. Electrical connectors bridge the cavity to connect the RF contacts on the circuit board to the RF contacts on the RF component and the DC contacts on the circuit board to the DC contacts on the RF component. A plug member is disposed in the cavity. The plug member has a dielectric member with an outer portion disposed over the RF and DC contacts on the circuit board and an inner portion elevated above the RF and DC contacts of the RF component. The plug member has one portion of electrical conductors disposed on an upper surface of the inner portion and another portion disposed under the outer portion on, and electrically connected to, the DC contacts on the circuit board.

In one embodiment, the circuit board has, in addition to the RF and DC contacts, a conductive layer patterned on the surface to provide portions of microwave transmission lines for coupling RF energy to, and from, the RF component. Portions of the patterned layer closer to the cavity provide strip conductors for microstrip transmission line portions of the microwave transmission lines and other portions of the patterned layer further away from the cavity provide strip conductors for stripline transmission line portions of the microwave transmission lines.

In one embodiment, a ground plane board is provided having a dielectric member and a conductive layer on the bottom surface of the dielectric member, the conductive layer being disposed on portions of a conductive layer on the circuit board. The ground plane board has a cavity exposing the RF and DC contacts of the circuit board and for receiving the plug member. Portions of the conductive layer of the ground plane board disposed over the strip conductors provide an upper ground plane conductor for the stripline transmission lines.

In one embodiment, a shielding layer is provided disposed, and electrically connected to: the conductive ground layer of the ground plane board; and, the portion of electrical conductors disposed on the upper surface of the inner portion of the plug member.

In one embodiment, a component supporting board is provided having a dielectric member and a conductive layer on the bottom of the dielectric member. The electrically conductive layer of the component supporting board is disposed on, and electrically connected to: the conductive layer of the ground plane board; and, the portion of electrical conductors disposed on the upper surface of the inner portion of the plug member.

With such an arrangement, only two cavities are required; a cavity for the RF component and a cavity for RF and DC connections between the RF component and the circuit board. Further, with such arrangement, the x-y surface footprint is reduced by attaching surface amount components above the cavities. This effectively uses the z-dimension to greatly reduce the x-y footprint and therefore the overall cost. This embedded solution has advantages over other embedded options as it permits die level rework, critical in high valued added, complex assemblies. It also enables embedding without sacrificing thermal performance of the prior art (FIG. 1). The plug or insert is designed in such a way that dielectric loading is not an issue as it is elevated above the MMIC. Ground fencing is provided to maintain shielding. Further, the structure uses a Ball Grid Array (BGA) on top of the plug for easy connection to the component supporting mating board. The mating board holds all of the Surface Mount components on its topside and has BOA connections on its back side. This is a low cost board with no cavities. Its BOA connections not only connect the DC but also create ground in desired areas. This ground fencing is provided to maintain shielding. Thus, all three parts required for this solution (the RF circuit board, the DC insert and the component supporting mating board) become very low cost components reducing the overall costs.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

FIG. 11A is a perspective view showing the bottom surface of a printed circuit board used with the portion of structure of FIGS. 10A and 10B according to an alternative embodiment of the disclosure; and FIG. 11B is a perspective view showing the top surface of a board used with the portion of structure of FIGS. 10A and 10B according to an alternative embodiment of the disclosure.

Like reference symbols in the various drawings indicate like elements.

DETAILED DESCRIPTION

Figure 2:
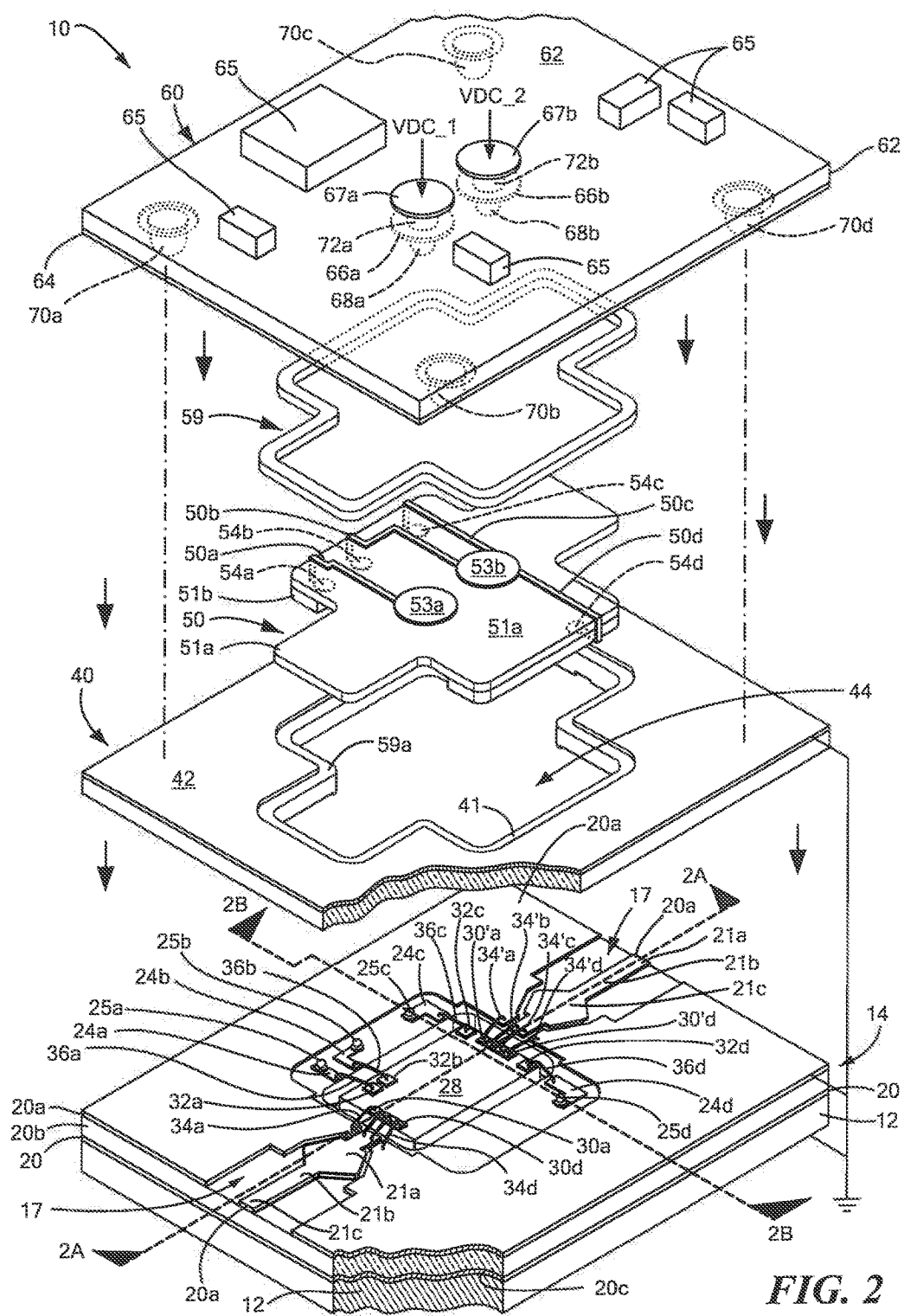
FIG. 2 is diagrammatical, exploded, perspective sketch of an RF circuit module according to the disclosure.
Figure 2A:
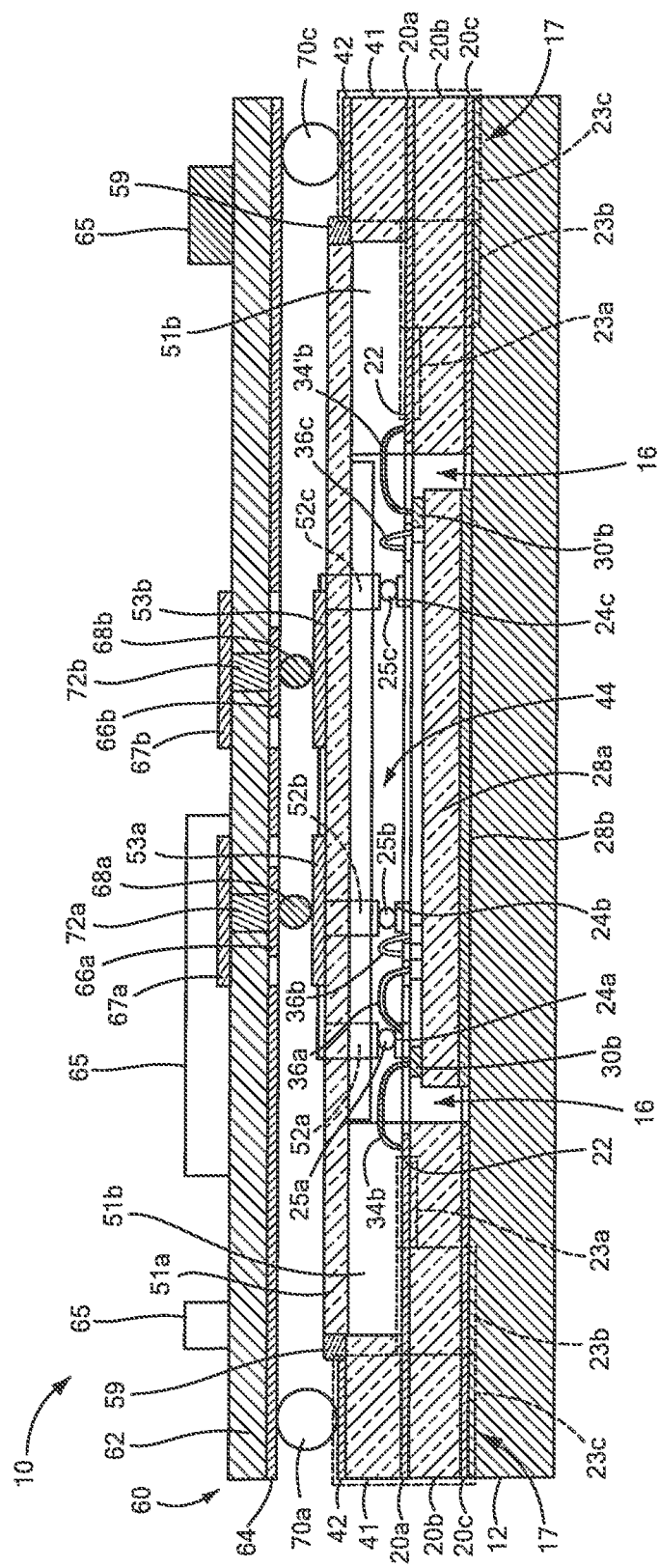
FIG. 2A is a cross-sectional view of the RF circuit module taken along line 2A-2A of FIG. 2.
Figure 2B:
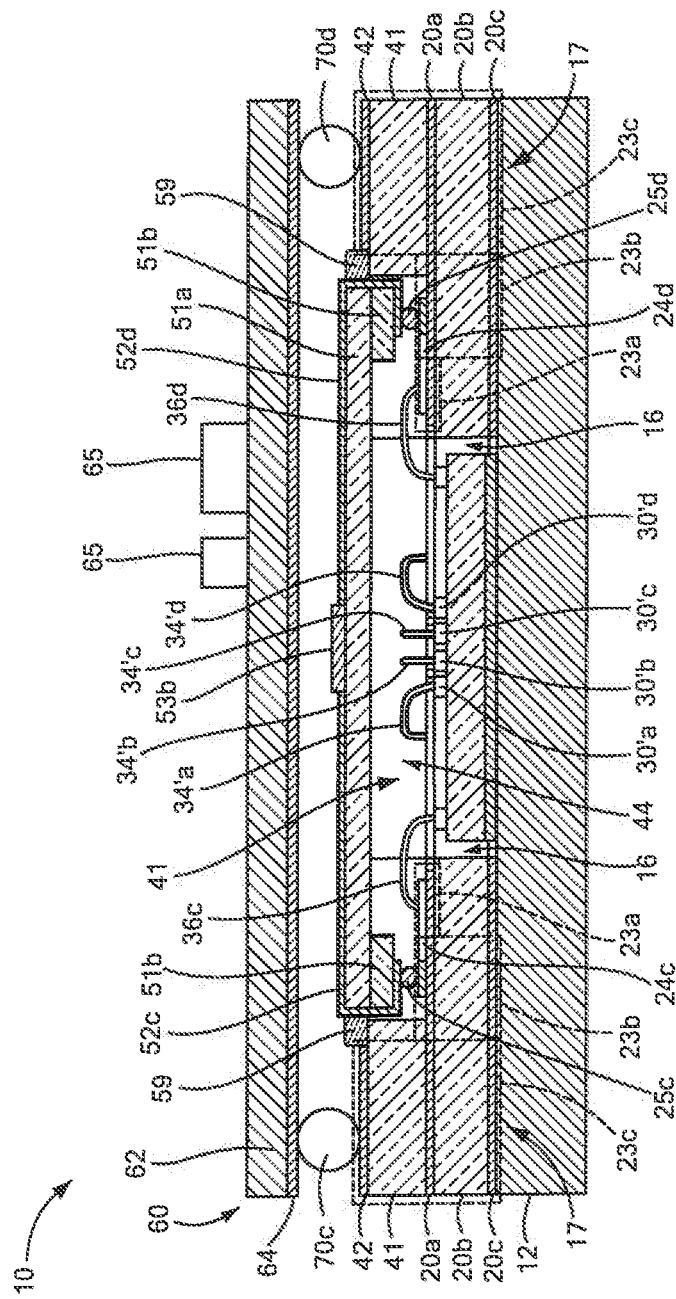
FIG. 2B is a cross-sectional view of the RF circuit module taken along line 2B-2B of FIG. 2.
Figure 3:
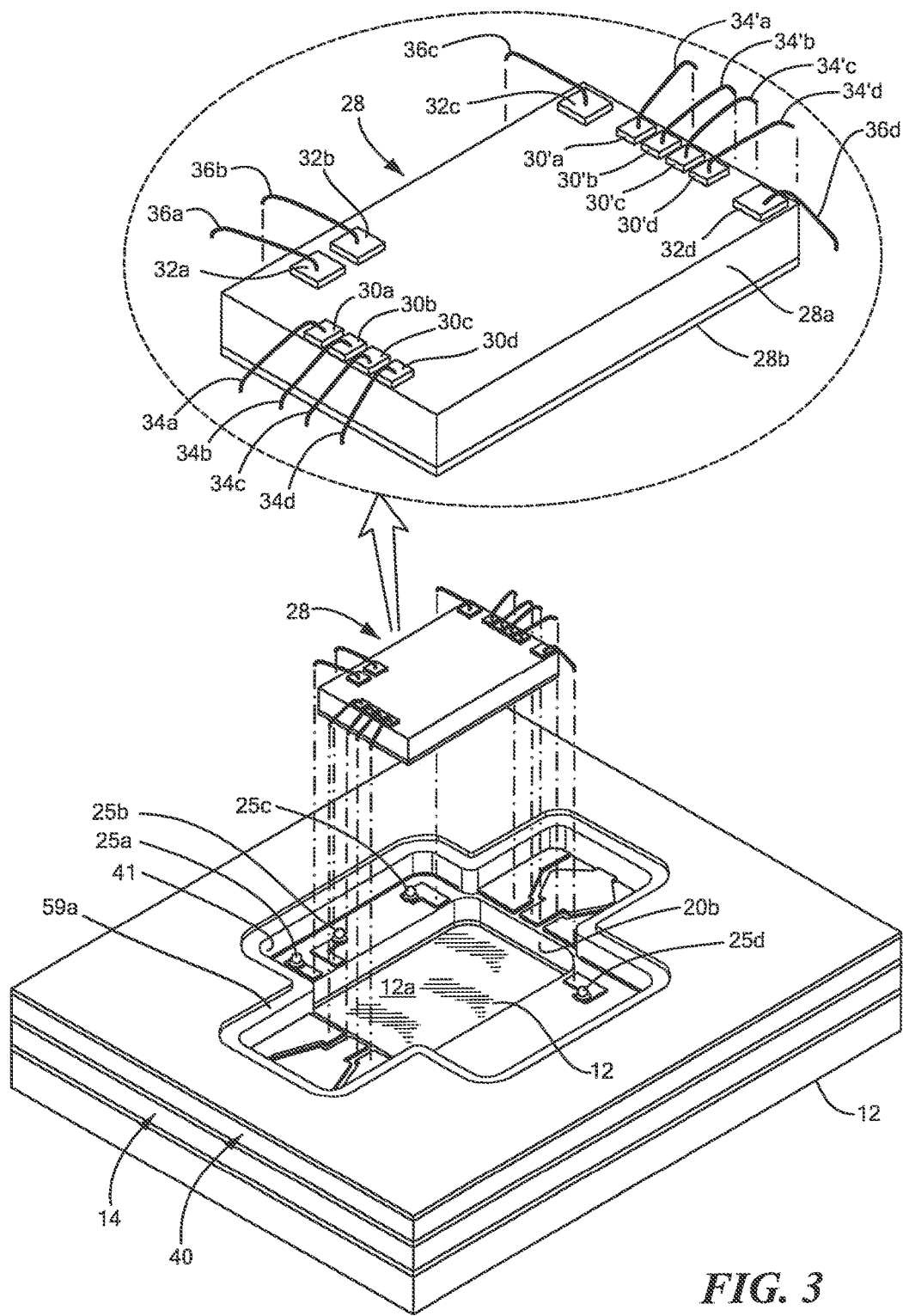
FIG. 3 is diagrammatical, exploded, perspective sketch of the RF circuit module of FIG. 2 at one stage in the assembly thereof.
Figure 4:
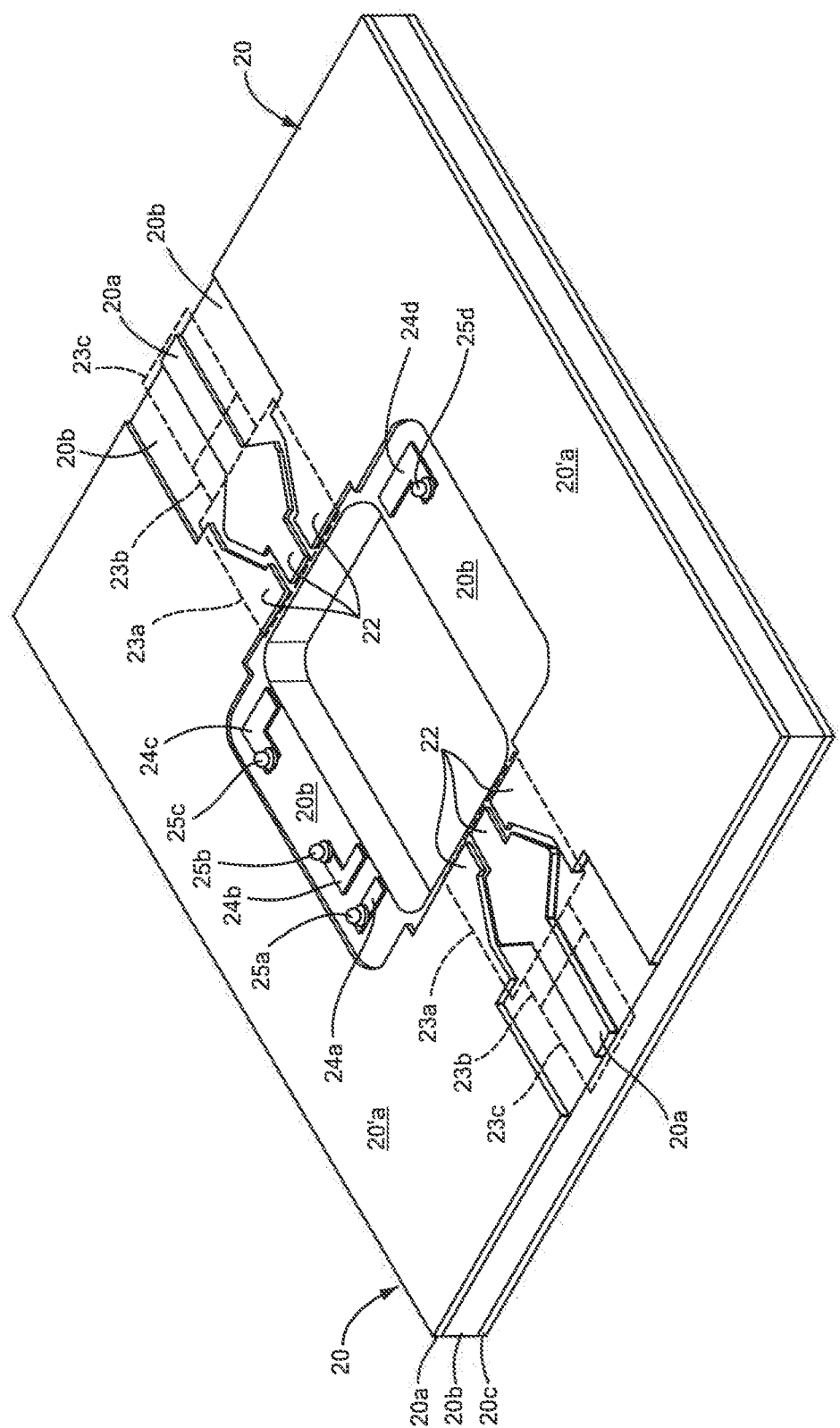
FIG. 4 is a diagrammatical, perspective sketch of a circuit board used in the RF circuit module of FIG. 2 according to the disclosure.

Referring now to FIGS. 2, 2A, and 2B, an RF circuit module 10 is shown having an electrically and thermally conductive, grounded support 12, here a cold plate; a printed circuit board 14 (see also FIG. 3) having a lower cavity 16 (FIGS. 2A and 2B) passing therethrough, shown more clearly in FIGS. 2A and 2B, therein exposing a portion 12a (FIG. 3) of an upper surface of the support 12. The printed circuit board 14 (FIG. 4) has a conductive layer 20 (FIGS. 3 and 4) on an upper surface of a dielectric 20b of board 14, such conductive layer 20 being patterned, as shown more clearly in FIG. 3, to provide signal strip conductors 20a and ground plane conductors 20'a on the upper surface of the dielectric 20b. A ground plane conductor 20c, here a copper base, is disposed on the bottom surface of the printed circuit board 14; the bottom surface being bonded to the portion of the surface of the cold plate 12 not exposed by the cavity 16 with any suitable conductive epoxy, not shown. The portions 21a of the strip conductor 20a adjacent (closest to) the cavity 16, form, with portions of the ground plane conductors 20'a on the upper surface of the dielectric 20b closest to such portions 21a of the strip conductor 20a, coplanar waveguide sections 23a. The next portion 21b of the strip conductors 20a form, with underlying portions of the ground plane conductor 20c, microstrip transmission line sections 23h; it being noted that, as will be described, a third portion 21c of the strip conductors 20a will provide a portion of a stripline transmission line 23c (FIGS. 2A and 2B) in a manner to be described. Thus, together, the coplanar waveguide sections 23a, the microstrip transmission line sections 23b and the stripline transmission line 23c provide microwave transmission lines 17 for coupling RF energy to and from the an RF component 28, shown in FIG. 3, here a MMIC chip 28a having a thermal heat spreader 28b under the chip 28a. It is noted that the portions of the strip conductors 20a and ground plane conductors 20'a adjacent to the lower cavity 16 also provide RF contact regions 22 on an upper surface of the dielectric 20b of the circuit board 14 (FIG. 4). Also formed on the upper surface of the dielectric 20b of the printed circuit board 14 is a plurality of, here for example, four DC contact pads 24a, 24b, 24c and 24d, as shown. Conductive features shown here as ball shaped, conductive contacts 25a-25d are formed on the pads 24a-24d, respectively, as shown.

The RF circuit module 10 includes, as noted above, an RF component 28, as shown in FIG. 3, here a MMIC chip 28a having a thermal heat spreader 28b under the chip 28a, the RF component 28 being disposed in the lower cavity 16 (FIGS. 2, 2A and 2B) on the exposed portion 12a of the surface of the electrically and thermally conductive support 12. The RF component 28, more particularly the chip 28a has a plurality of RF contact pads 30a-30d, 30'a-30'd (FIG. 3) where contact pads 30a, 30d, 30'a and 30'd are ground pads and contact pads 30b, 30c may be formed as one single, signal contact pad; likewise contact pads 30'b and 30'c may be formed as one single, signal contact pad, on an upper surface of the chip 28a and a plurality of DC contact pads 32a, 32b, 23c and 32d on the upper surface of the chip 28a, as shown in FIGS. 2, 2A, 2B and 3.

The RF circuit module 10 (FIGS. 2, 2A, 2B) includes: a plurality of RF electrical connectors 34a-34d and 34'a-34'd (FIGS. 2A, 2B, 3), here for example conductive wires, bridging the portion of the cavity 16 between the circuit board 14 and the RF component 28, each one of the plurality of RF electrical connectors 34a-34d and 34'a-34'd having one end connected to a corresponding one of the RF contact pads 30a-30d, 30'a-30'd, on the upper surface of the RF component 28 and another end of such first plurality of electrical conductors 34a-34d and 34'a-34'd connected to corresponding ones or pairs of the plurality of RF contact regions 22 on the upper surface of the circuit board 14, as shown. A plurality of DC electrical connectors 36a-36d, bridge portion of the cavity 16 between the circuit board 14 and the RF component 28, each one of the DC electrical connectors 36a-36d having one end connected to a corresponding one of the DC contact pads 32a, 32b, 32c and 32d on the upper surface of the RF component 28 and another end of such one of the DC electrical connectors 36a-36d connected to a corresponding one of the DC contact pads 24a-24d on the upper surface of the circuit board 14.

The RF circuit module 10 (FIGS. 2, 2A and 2B) includes a mating board 40 having a of dielectric support member 41 and an electrical conductor 42 on an upper surface of the dielectric support member 41. The bottom surface of the mating board 40 is disposed on, and bonded to, the upper surface of the circuit board 14, with any dielectric epoxy, not shown. It is noted that the mating board 40 has an upper cavity 44 passing through the mating board 40 in registration with the lower cavity 16, the upper cavity 44 being wider than the lower cavity 16, the upper cavity 44 exposing: the entire upper surface of the RF component 28 including the RF contacts 30*a*-30*d*, 30'*a*-30'*d* of the chip 28*a*; the DC contact pads 32*a*-32*d* of the chip 28*a*; the RF contact regions 22 of the strip conductors 20*a* on the upper surface of the circuit board 14; the DC contact pads 24*a*-24*d* on the upper surface of the circuit hoard 14; the RF electrical connectors 34*a*-34*d*, 34'*a*-34'*d*; and the second electrical connectors 36*a*-36*d*.

Figures 5A, 5B:
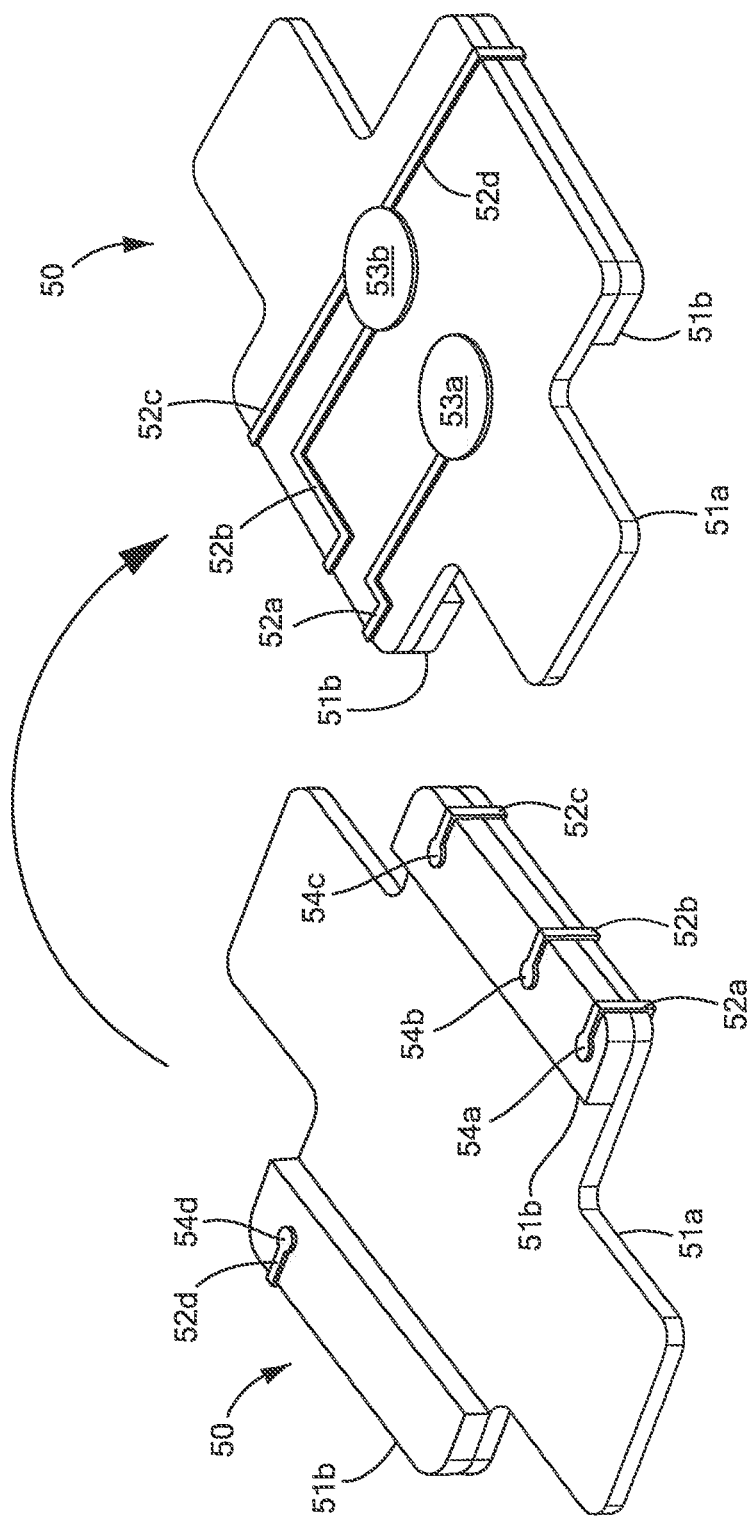
FIG. 5A is a perspective view showing the bottom surface of a plug used in the RF circuit module of FIG. 2 according to the disclosure.
FIG. 5B is a perspective view showing the top surface of a plug of FIG. 5A used in the RF circuit module of FIG. 2 according to the disclosure.

As described above, and referring also to FIG. 4, the portion 21*a* of the strip conductors 20*a* adjacent the cavity 16 form coplanar waveguide sections 23*a*. The coplanar waveguide sections 23*a* are connected to a portion of the strip conductors 21*b*, which with the portion of the dielectric layer 20*b* and conductive layer 20*c* under this portion of the strip conductor 21*b* form a microstrip transmission line section 23*b*. The third portion 21*c* of the strip conductors 20*a* connected to the microstrip transmission line section 23*b* provides, with portions of the conductive layer 42 over the third portion 21*c* and the portion of the conductive layer 20*c* under the third portions 21*c*, a stripline transmission line 23*c*. The coplanar waveguide 23*a*, microstrip transmission line 23*b*, and stripline transmission lines 23*c* provide microwave transmission lines for RF signals passing to, and from, the MMIC chip 28. Thus, the electrical conductor 42 of the mating board 40 provides the upper ground plane conductor of the portion of the conductive layer 20*c* used to form the stripline transmission line The RF circuit module 10 includes a plug member, or insert, 50, shown in more detail in FIGS. 5A and 5B disposed in the upper cavity 44, as shown in FIGS. 2, 2A and 2B. More particularly, and referring to FIGS. 5A and 5B, the plug member, or insert, 50 is here, has a plurality of, here four, electrical conductors 52*a*-52*d* formed thereon, for example by printing or additive manufacturing, as shown. More particularly, the plug member 50 has an upper layer 51.*a* for example, a fusion-formed glass, although options may be used and a pair of opposing side members 51*b* here a printed dielectric, as for example Creative Materials EXP 2650-68HV. It could be understood that insert 50 may be one integral piece of printed material such as formed by fusion deposition modeling of for example, polyetheretherketone (PEEK). Thus the upper layer 51*a* of the plug member 50 is thinner than the pair of opposing side members 51*b*. The conductors 52*a*-52*d* are formed on the upper surface of the upper layer 51*a* and wrap around the sides of the side members 51*b*, as shown, and terminate at electrical contacts 54*a*-54*d*, respectively, on the underside of the side members 51*b*, as shown. It is noted that the conductor 52*a* is connected to contact 53*a* and conductors 52*b*-52*c* are connected to contact 53*b*.

Figure 6:
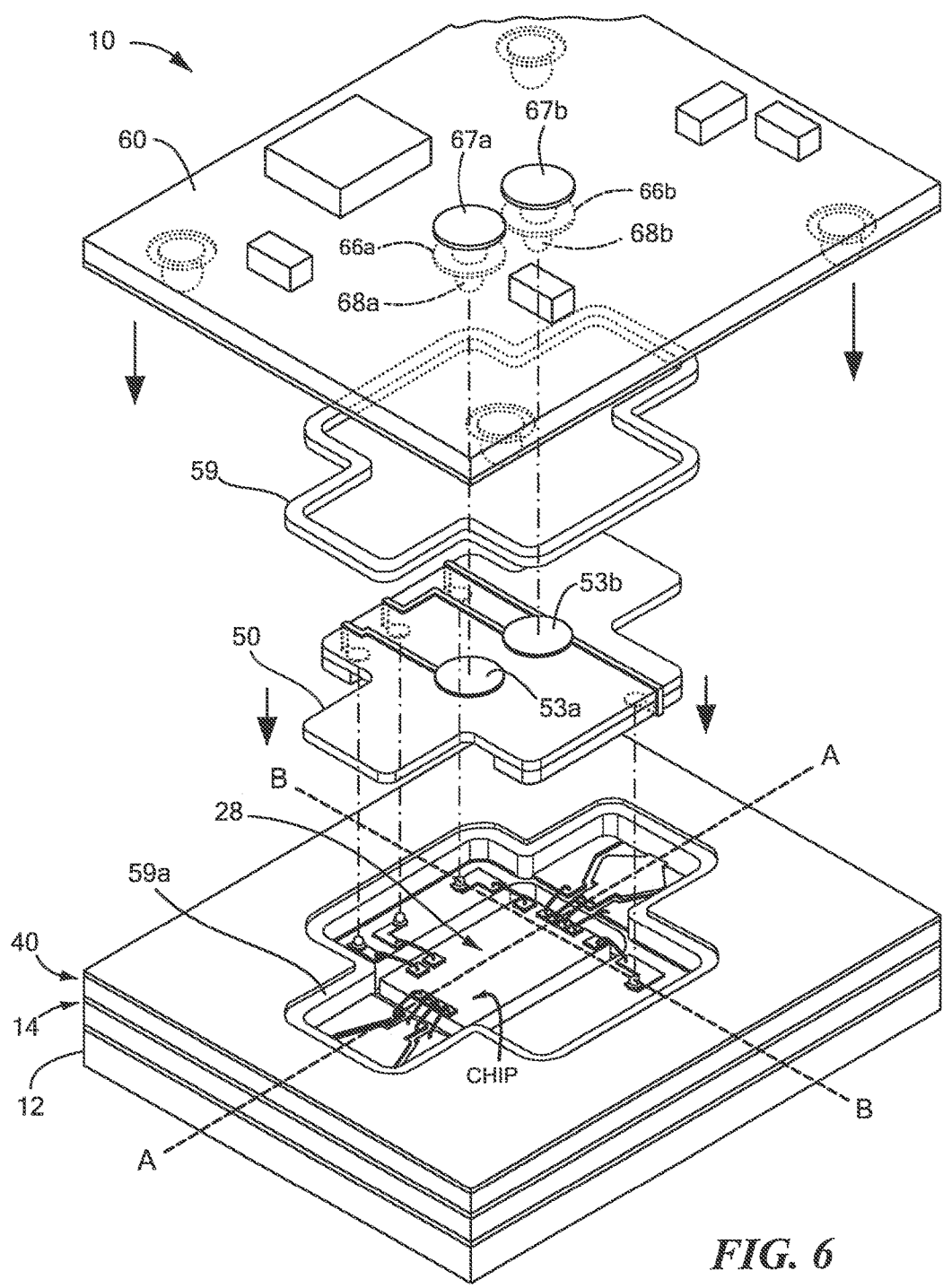
FIG. 6 is diagrammatical, exploded, perspective sketch of the RF circuit module of FIG. 2 at another stage in the assembly thereof.
Figures 7A, 7B:
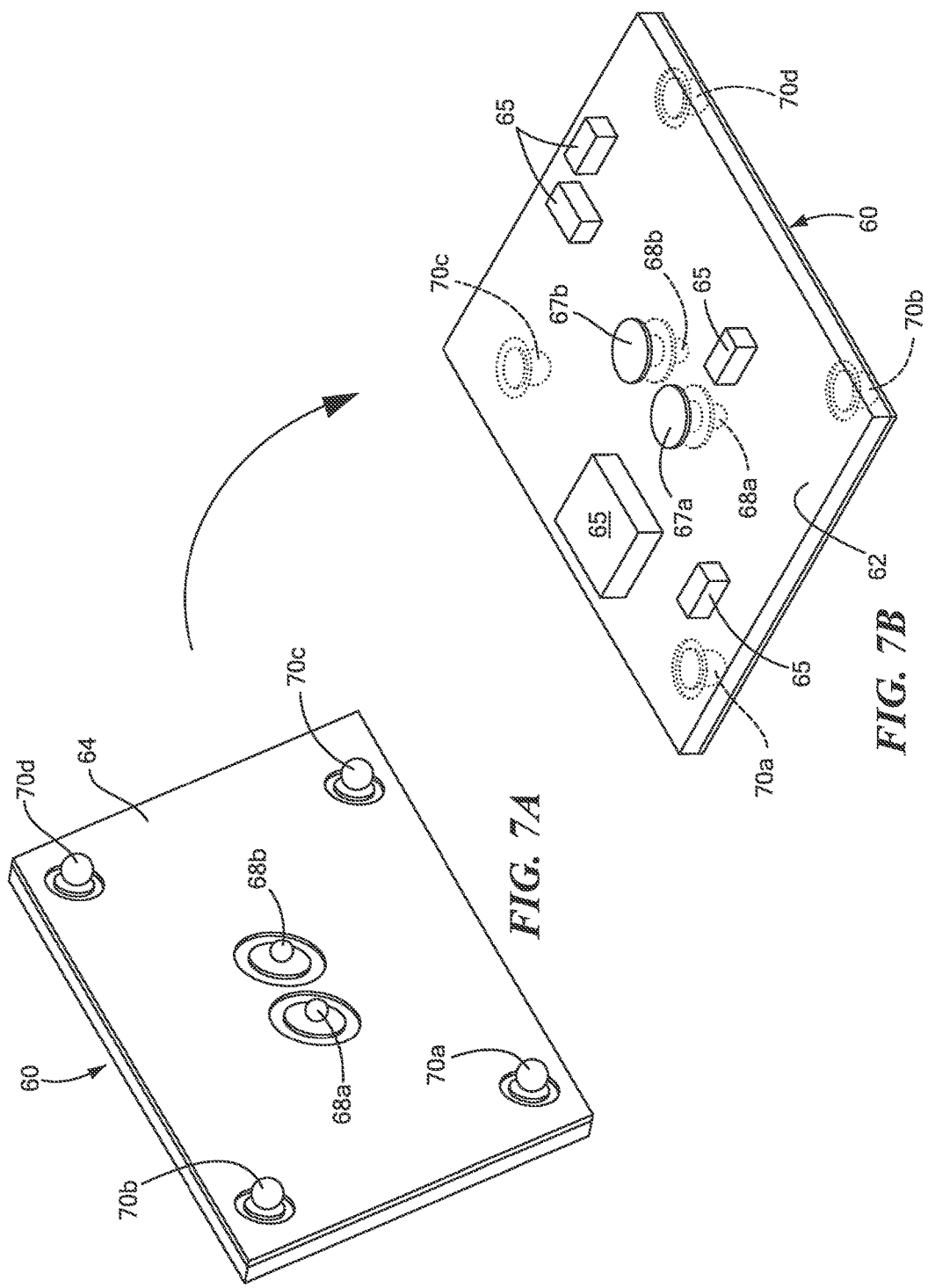
FIG. 7A is a perspective view showing the bottom surface of a printed circuit board used in the RF circuit module of FIG. 2 according to the disclosure.
FIG. 7B is a perspective view showing the top surface of a board of FIG. 7A used in the RF circuit module of FIG. 2 according to the disclosure.
Figure 8:
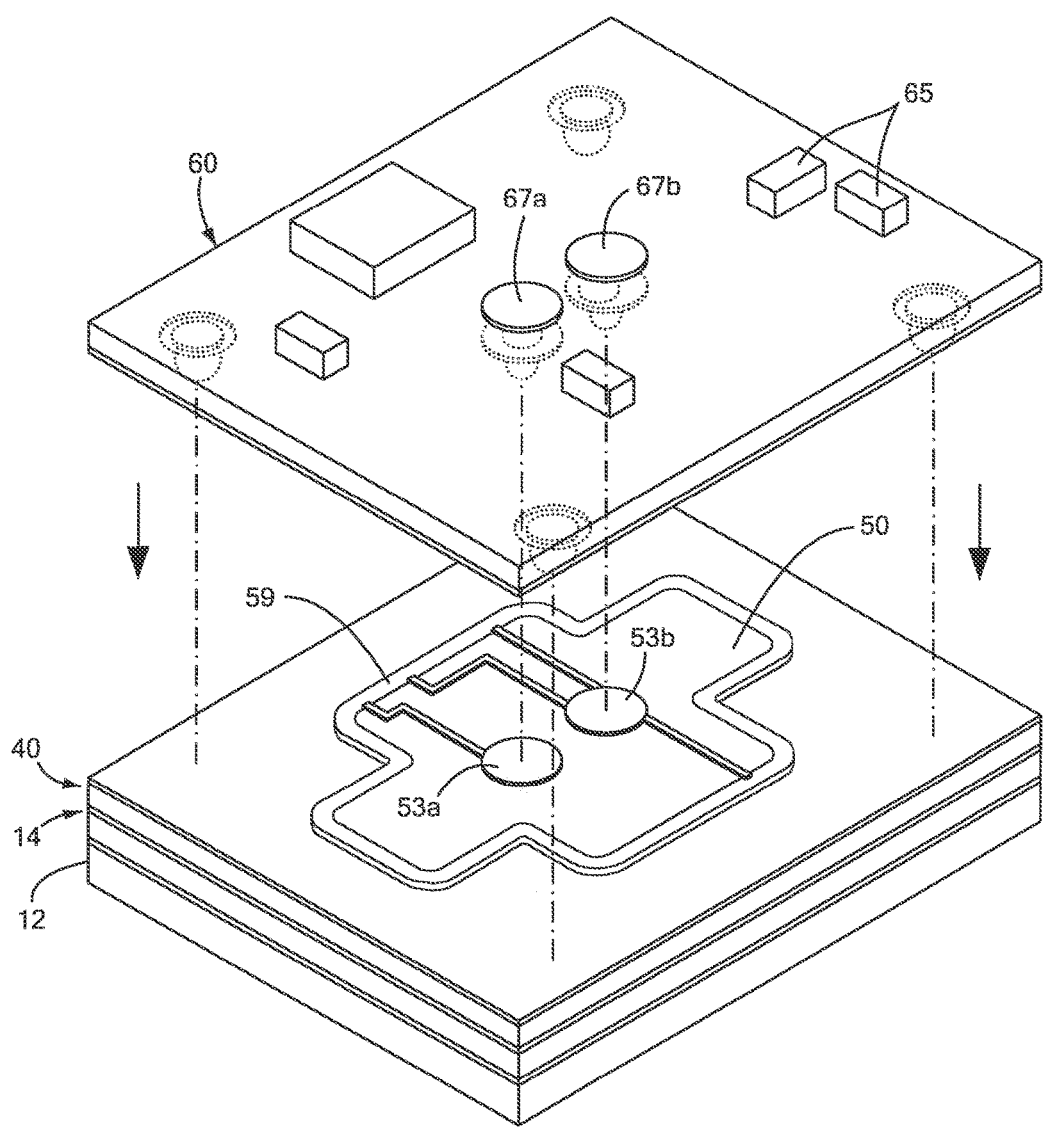
FIG. 8 is diagrammatical, exploded, perspective sketch of the RF circuit module of FIG. 2 at yet another stage in the assembly thereof.
Figure 9:
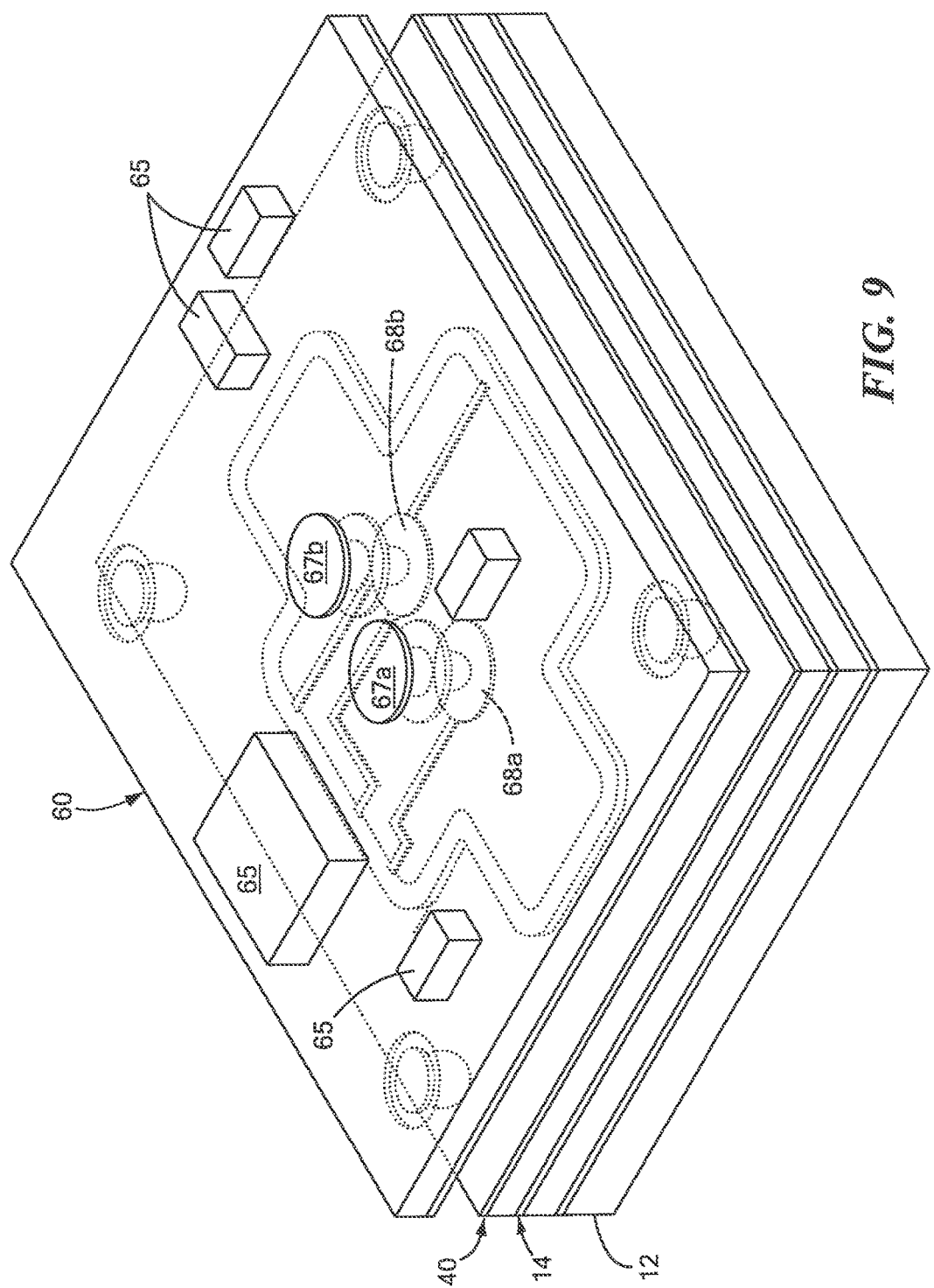
FIG. 9 is diagrammatical perspective sketch of the RF circuit module of FIG. 2 fully assembled.

Referring again to FIGS. 2, 2A, and 211, after forming the plug member 50 (FIGS. 5A, 5B), the plug member 50 is inserted into the upper cavity 44 (FIG. 6); it being noted that contacts 54*a*-54*d* make contact with DC contacts 24*a*-24*d*, more particularly on the electrically conductive features, here for example balls shaped conductive contacts 25*a*-25*d*, respectively, as shown. It is noted that the side members 51*b* elevate the inner region of the plug member 50 over the RF module 28 and over the wires 34*a*-34*d*, 34'*a*-34*d* and 32*a*-32*d*, as shown in FIGS. 2A and 2B. After inserting the plug member 50 as described, a dielectric gap filling material 59, such as silicone, is injected between the outer edges of the plug member 50 and the inner edges of the electrical conductor on mating board 40 and sits on a portion 59*a* of mating board 40; such dielectric gap filling material 59 having a coefficient of therrmal expansion (CTE) selected to enable expansion and between the plug member 50 on the mating board 40. The RF circuit module 10 (FIGS. 2, 2A and 2B, includes a dielectric component supporting board 60 (FIGS. 7A, 7B). The supporting board 60 includes a dielectric support member 62 having a conductive layer 64, patterned as shown in FIGS. 7A, 7B, on the bottom surface of the support member 62, as shown in FIGS. 2, 2A and 2B and a plurality of electrical components 65 disposed on the upper surface of the dielectric component supporting board 60, as shown. It should be understood that these electrical components 65 are typically interconnected by patterned conductors, not shown, on the upper surface of the dielectric component supporting board 60 using conventional printed circuit techniques. Also formed on the upper surface of the dielectric support member 62 is a pair of DC contact pads 67*a*, 67*b* which are here connected to two DC voltage sources; VDC_1 and VDC_2 respectively, there coupling to DC contact pad 32*a* and VDC_2 to DC contact pads 32*b*, 32*c* and 32*d*. As noted above, the conductive layer 64 on the bottom of the support layer 60 is patterned as shown to have a pair of dielectrically isolated, ball shaped, DC contacts 68*a*, 68*b* and a plurality of, here four, ball shaped, electrically ground shielding, or ground fencing, contacts 70*a*-70*d* at desired points, as shown. The pair of DC contacts 68*a*, 68*b* are electrically connected to contact pads 66*a*, 66*b*, respectively as shown through electrically conductive vias 72*a*, 72*b*, respectively, passing through the dielectric layer 62, as shown. The balls contacts 68*a*, 68*h* of the bottom of the dielectric component supporting board 60 are, when assembled (FIGS. 8 and 9), disposed on, and electrically connected to, DC contacts 53*a*, 53*b*, respectively as shown in FIGS. 2, 2A and 2B.

This design can be further extended to applications where the DC interconnects are too numerous to accommodate direct attachment to the pads 53*a*, 53*b* on the top of the DC insert 50. In this case, and referring to FIGS. 10A-10B, a plurality of here for example, three, conductive traces 80*a*-80*c* can be written from the top of the DC insert 50, over the gap filling dielectric material 59 and connecting to a corresponding one of a plurality of, here three, BGA pads 82*a*-82*c* on layer 42 and dielectrically isolated one from another by portions of dielectric 41. More particularly, apertures are formed in the conductive layer 42 to expose portions underlying portions of the surface of the dielectric support member 41. The BGA pads 82*a*-82*c* are formed on the exposed portions of the dielectric 41 and provide additional DC contacts. It is noted that conductive trace 80*a* is an extension of conductor 52*a* and thereby connects pad 82*a* to pad 53*a*, trace 80*b* is an extension of conductor 52*c* and thereby connects pad 82*b* to pad 53*b*, and trace 80*c* is an extension of conductor 52*d* and thereby connects pad 82*c* to pad 53*b*, as shown.

Figure 1:
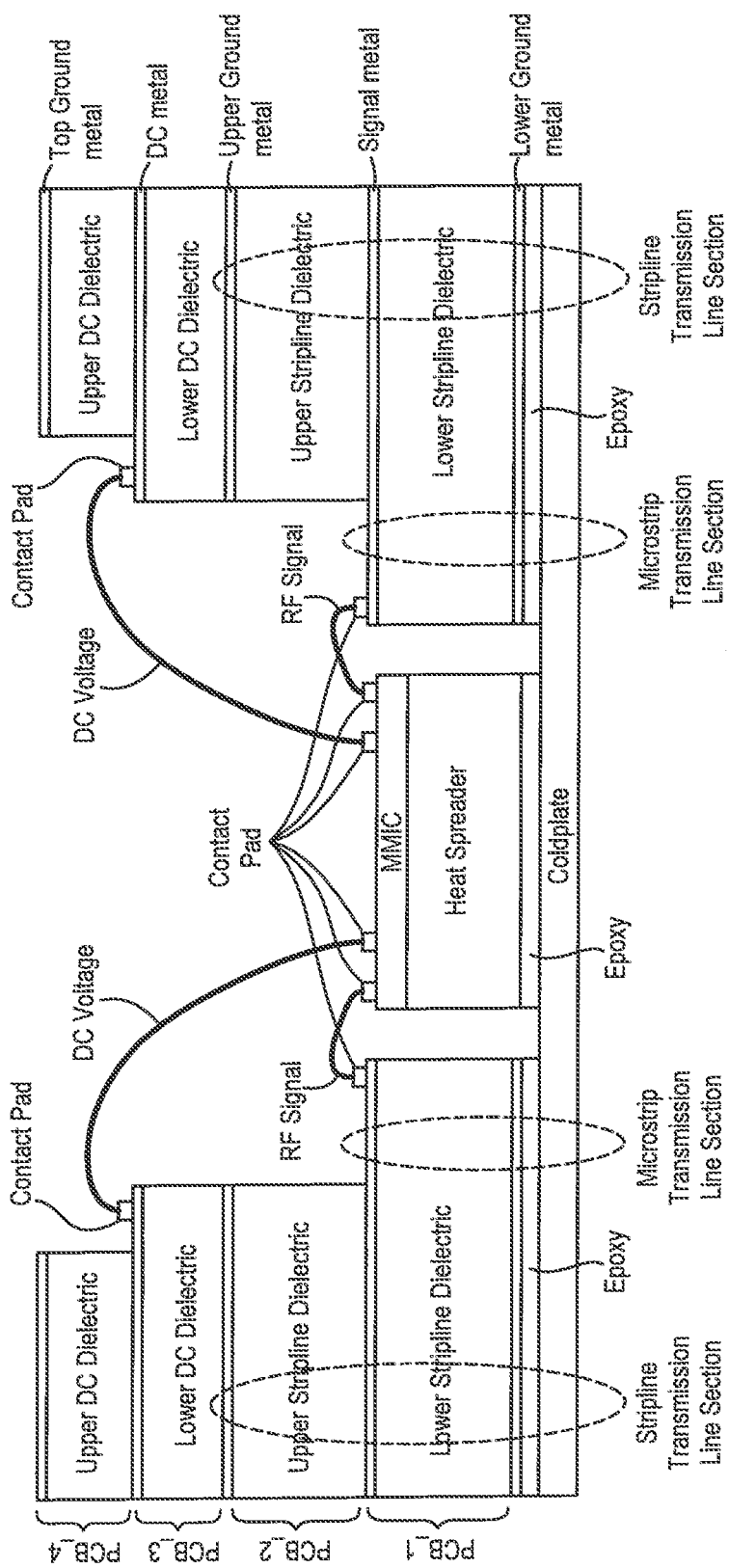
FIG. 1 is a simplified, diagrammatical, cross-sectional view sketch of an RF circuit module according to the PRIOR, ART.
Figure 10A:
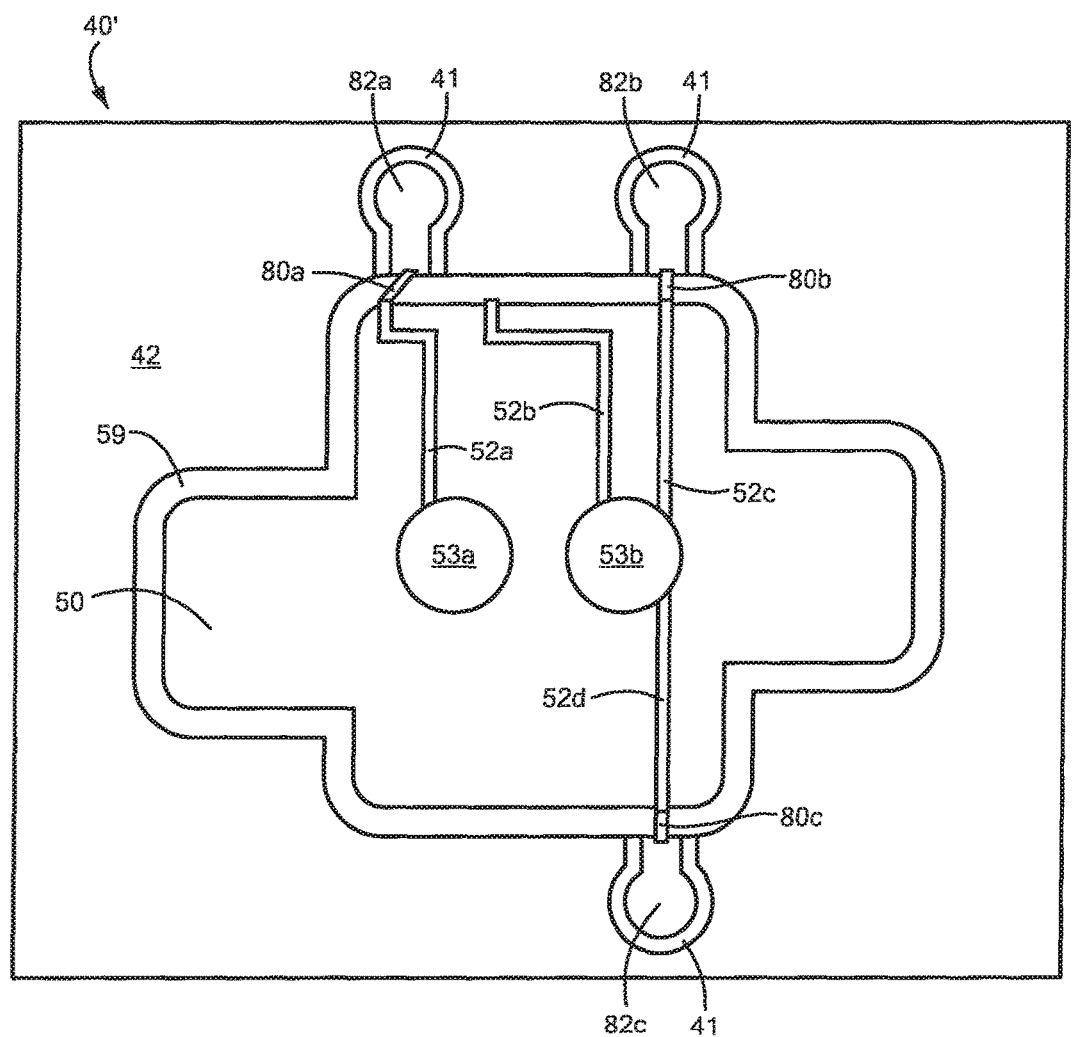
FIG. 10A is a top view of a portion of structure adapted for use in the RF circuit module of FIG. 2 according to an alternative embodiment of the disclosure.
Figure 10B:
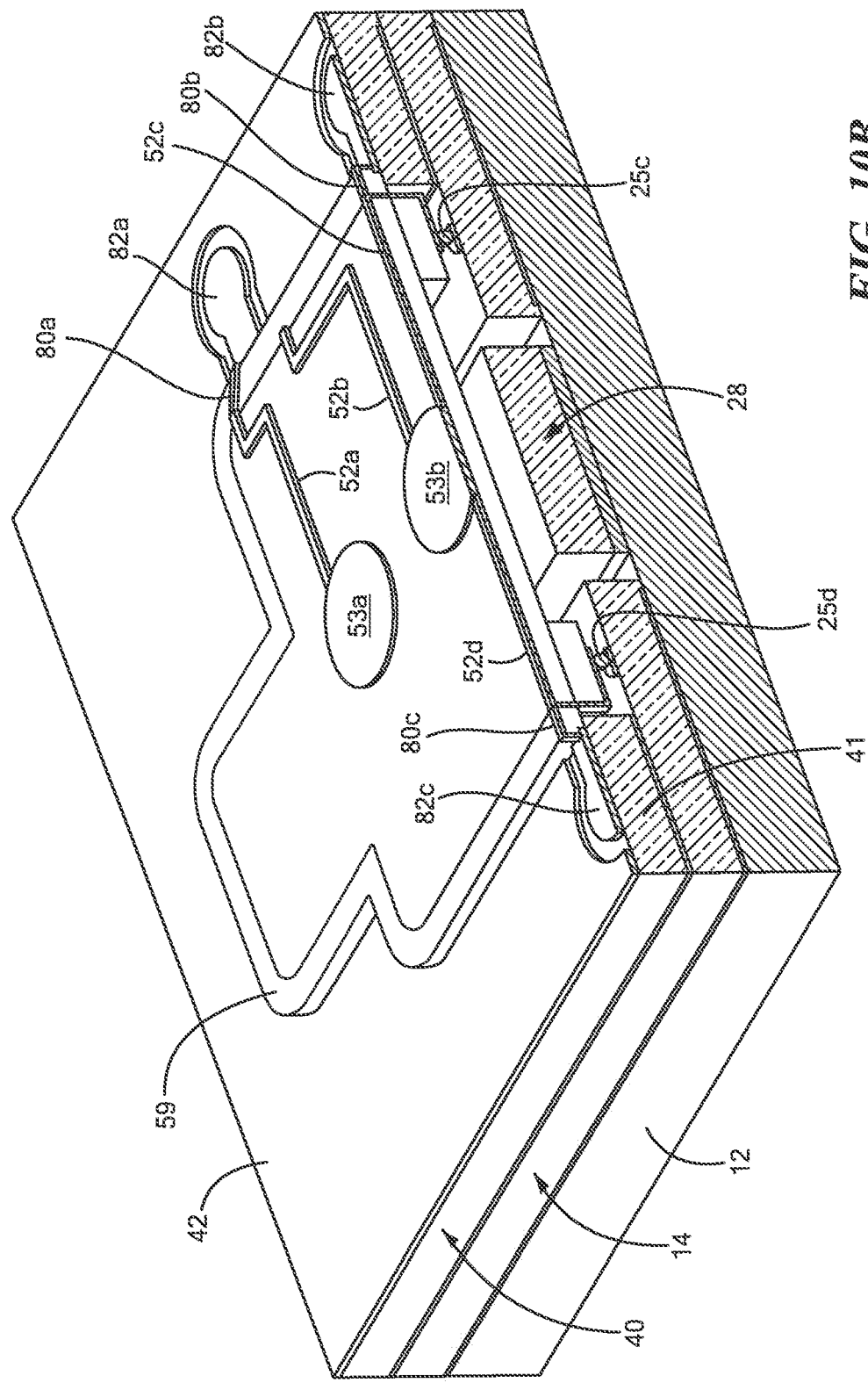
FIG. 10B is a perspective, cross-sectional view of the portion of structure of FIG. 10A according to an alternative embodiment of the disclosure.

Referring now also to FIGS. 11A and 11B, the dielectric component supporting board 60 for use with the structure shown in FIGS. 10A and 10B is modified to have formed therethrough three additional, electrically isolated, electrically conductive contact pads 88*a*, 88*b* and 88*c* on the top of the dielectric component supporting board 60', such contact pads 88*a*, 88*b* and 88*c* being electrically connected to conductive balls contacts 84*a*, 84*b* and 84*c*, respectively, on the bottom of dielectric component supporting board 60' through electrically conductive vias, not shown, which pass through the dielectric layer 62. It should be understood that the ground plane conductors of the various boards are connected together and to the grounded support 12 (FIG. 1) by conventional conductive vias, not shown, represented schematically in FIG. 2 by line GIN), as shown.

It is noted that the top of the insert 50 has BGA-style pads provided by ball shaped conductive contacts 25a-25d for easy connection to the mating board 40. The mating board 60 holds all of the Surface Mount components 65 on its topside and has BGA connections 68 and 70 on its back side. Thus mating board 60 is a low cost board with no cavities. Its BGA connections 68 and 70 here, in this embodiment, create ground shielding, or fencing, connections, as described above, in desired areas.

A number of embodiments of the disclosure have been described. Nevertheless, it will be understood that various modifications may be made without departing from the spirit and scope of the disclosure. For example, more DC contacts may be used on the MMIC and more DC contacts may be formed on the plug. Accordingly, other embodiments are within the scope of the following claims.

What is claimed is:

1. An RF circuit module, comprising:
a circuit board having RF and DC contacts on a surface of the circuit board, the circuit board having a cavity therein;
an RF component having RF and DC contacts disposed in the cavity of the circuit board;
a plurality of electrical connectors bridge the cavity to connect the RF contacts on the circuit board to the RF contacts on the RF component and the DC contacts on the circuit board to the DC contacts on the RF component; and
a plug member, disposed in the cavity, the plug member comprising: a dielectric member with an outer portion disposed over the RF and DC contacts on the circuit board; an inner portion elevated above the RF and DC contacts of the RF component; and one portion of electrical conductors disposed on an upper surface of the inner portion and another portion disposed under the outer portion on, and electrically connected to, the DC contacts on the circuit board.

2. The RF circuit module recited in claim 1 wherein the circuit board includes a conductive layer patterned on the surface to provide portions of microwave transmission lines for coupling RF energy to, and from, the RF component, portions of the patterned layer closer to the cavity providing strip conductors for microstrip transmission lines portions of the microwave transmission lines and other portions of the patterned layer further away from the cavity providing strip conductors for stripline transmission lines portions of the microwave transmission lines.

3. The RF circuit module recited in claim 2 including a ground plane board having a dielectric member and a conductive layer, the conductive layer being disposed on a bottom surface of the dielectric member, the conductive layer being disposed on portions of a conductive layer on the circuit board.

4. The RF circuit module recited in claim 2 wherein the ground plane board has a cavity therein exposing the RF and DC contacts of the circuit board and for receiving the plug member, portions of the conductive layer of the ground plane board being disposed over the strip conductors provide an upper ground plane conductor for the stripline transmission lines.

5. The RF circuit module recited in claim 4 including a shielding layer disposed, and electrically connected to: the conductive layer of the ground plane board; and, the portion of electrical conductors disposed on the upper surface of the inner portion of the plug member.

6. The RF circuit module recited in claim 5 including a component supporting board having a dielectric member and a conductive layer on the bottom of the dielectric member, the electrically conductive layer of the component supporting board being disposed on, and electrically connected to: the conductive layer of the ground plane board; and, the portion of electrical conductors disposed on the upper surface of the inner portion of the plug member.

7. A structure, comprising:
(A) a support;
(B) a circuit board having a lower cavity therein exposing a portion of a surface of the support, the circuit board comprising:
  (a) a microwave transmission line having an RF contact pad on an upper surface of the circuit board;
  (b) a DC contact pad on the upper surface of the circuit board;
(C) an RF component disposed in the lower cavity on the exposed portion of the surface of the support, the RF component having an RF contact pad on an upper surface of the RF component and a DC contact pad on the upper surface of the RF component;
(D) a first electrical connector bridging the lower cavity having one end connected to the RF contact pad on the upper surface of the RF component and another end connected to the RF contact pad on the upper surface of the circuit board;
(E) a second electrical connector bridging the lower cavity having one end connected to the DC contact pad on the upper surface of the RF component and another end connected to the DC contact pad on the upper surface of the circuit board;
(F) a dielectric board having an electrically conductive upper surface and a bottom surface disposed on the upper surface of the circuit board, the dielectric board having an upper cavity in registration with the lower cavity, the upper cavity being wider than the lower cavity, the upper cavity exposing: the RF contact of the RF component; the DC contact pad of the RF component; the RF contact pad on the upper surface of the circuit board; the DC component on the upper surface of the circuit board; the first electrical connector; and the second electrical connector;
(G) a plug member, disposed in the upper cavity, comprising: a dielectric support; and, an electrical conductor having a first portion disposed on a top surface of the dielectric support connected to the electrically conductive upper surface of the dielectric board and a second portion disposed on a bottom surface of the dielectric support, the second portion of the electrical conductor being disposed on the DC contact pad on the surface of the circuit board.

8. The structure recited in claim 7 wherein the electrically conductive upper surface of the dielectric board has an aperture therein; and wherein the aperture exposes an underlying portion of the upper surface of the dielectric board and including an additional DC contact disposed on the exposed portion cif the upper surface of the dielectric board; and wherein the additional DC contact is electrically connected to the electrical conductor on the top surface of the dielectric support of the plug member.

9. The structure recited in claim 8 wherein the additional DC contact is electrically connected to the electrical conductor on the top surface of the dielectric support of the plug member by an electrical contact passing over the upper cavity.

10. A structure for connecting RF and DC energy to an RF component, comprising:
(A) a support;
(B) a circuit board, having a cavity therein exposing a portion of a surface of the support, comprising:
(a) a stripline transmission line section comprising: a center strip conductor separated from: a lower ground plane conductor by a lower dielectric and an upper ground plane conductor by an upper dielectric; and
(b) a DC contact pad disposed on a first portion of the surface of the lower dielectric;
(c) an RF contact pad disposed on a first portion of the surface of the lower dielectric;
(d) a microstrip transmission line section having:
(i) one end connected to a strip conductor connected to the center strip conductor of the stripline transmission line section and a second end connected to the RF contact pad;
(ii) wherein the strip conductor of the microstrip transmission line section is disposed on the upper surface of the lower dielectric and separated from the lower ground plane conductor by the lower dielectric; and
(e) wherein a lower portion of the cavity is formed in the lower dielectric and an upper, wider portion of the cavity is formed in the upper dielectric;
(C) an RF component disposed in the lower portion of the cavity and disposed on the exposed portion of the surface the support, the RF component having an RF contact pad for RF energy and a DC contact pad for DC energy, wherein the RF contact pad of the RF component is connected to the RF contact pad of the circuit board; and
(D) a plug member, disposed in the upper portion of the cavity, comprising: a dielectric support; and, an electrical conductor having a first portion disposed on a top surface of the dielectric support and a second portion disposed on a bottom surface of the dielectric support, the second portion of the electrical conductor being disposed on the DC contact pad of the circuit hoard.

11. The structure recited in claim 10 including an electrically conductive member disposed on and electrically connected to: the upper ground plane conductor and the portion of the electrical conductor disposed on the top surface of the dielectric support of the plug member.

12. A structure, comprising:
a support;
a circuit board having a lower cavity therein exposing a portion of a surface of the support, the circuit board comprising:
a microwave transmission line having an RF contact pad on an upper surface of the lower circuit board;
a plurality of DC contact pads on the upper surface of the lower circuit board; a plurality of RF contact pads on the upper surface of the lower circuit board;
an RF component disposed in the cavity on the exposed portion of the surface of the support, the RF component having a plurality of RF contact pads on an upper surface of the RF component and a plurality of DC contact pads on the upper surface of the RF component;
a first plurality of electrical connectors bridging the lower cavity, each one of the first plurality of electrical connectors having one end connected to a corresponding one of the RF contact pads on the upper surface of the RF component and another end of such one of plurality of conductors connected to a corresponding one of the plurality of RF contact pads on the upper surface of the circuit board;
a second plurality of electrical connector bridging the lower cavity, each one of the second plurality electrical connectors having one end connected to a corresponding one of the DC contact pads on the upper surface of the RF component and another end of such one of the second plurality of electrical connectors connected to a corresponding one of the DC contact pads on the upper surface of the circuit board;
a dielectric board having an electrical conductor on an upper surface and a bottom surface disposed on the upper surface of the circuit board, the dielectric board having an upper cavity in registration with the lower cavity, the upper cavity being wider than the lower cavity, the upper cavity exposing: the RF contact of the RF component; the DC contact pad of the RF component; the RF contact pad on the upper surface of the circuit board; the DC component on the upper surface of the circuit board; the first electrical connector; and the second electrical connector;
a plug member, disposed in the upper cavity, comprising: a dielectric support; and, a plurality of electrical conductors having a first portion disposed on a top surface of the dielectric support each one being connected to the electrical conductor on the upper surface of the dielectric board and a second portion disposed on a bottom surface of the dielectric support, the second portion of each one of the electrical conductors being disposed on, and electrically connected to, a corresponding one of the plurality of DC contact pads on the upper surface of the circuit board.

* * * * *